United States Patent
Wang

(10) Patent No.: US 10,453,709 B2
(45) Date of Patent: Oct. 22, 2019

(54) LIQUID PARTICLE COUNTING OF SEMICONDUCTOR COMPONENT PARTS

(71) Applicant: Applied Materials, Inc., Santa Clara, CA (US)

(72) Inventor: Jiansheng Wang, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 71 days.

(21) Appl. No.: 15/488,538

(22) Filed: Apr. 17, 2017

(65) Prior Publication Data

US 2017/0330771 A1  Nov. 16, 2017

Related U.S. Application Data

(60) Provisional application No. 62/348,529, filed on Jun. 10, 2016, provisional application No. 62/336,253, filed on May 13, 2016.

(51) Int. Cl.

| H01L 21/67 | (2006.01) |
| B08B 3/12 | (2006.01) |
| B08B 3/14 | (2006.01) |
| B08B 3/00 | (2006.01) |
| B08B 3/10 | (2006.01) |
| C11D 11/00 | (2006.01) |
| H01L 21/66 | (2006.01) |

(52) U.S. Cl.
CPC .......... *H01L 21/67057* (2013.01); *B08B 3/00* (2013.01); *B08B 3/10* (2013.01); *B08B 3/12* (2013.01); *B08B 3/14* (2013.01); *C11D 11/0047* (2013.01); *H01L 21/67253* (2013.01); *H01L 22/26* (2013.01)

(58) Field of Classification Search
CPC .......... H01L 21/6704; H01L 21/67057; H01L 21/253; H01L 22/26; B08B 3/00; B08B 3/10; B08B 3/12; B08B 3/14
See application file for complete search history.

(56) References Cited

U.S. PATENT DOCUMENTS

| 2002/0020837 A1 | 2/2002 | Sherwin |
| 2003/0034046 A1 | 2/2003 | Guldi |
| 2003/0159713 A1 | 8/2003 | Park et al. |
| 2006/0213538 A1* | 9/2006 | Umezawa ................. B08B 3/04 |
| | | 134/18 |
| 2012/0216833 A1 | 8/2012 | Wang et al. |
| 2016/0056061 A1 | 2/2016 | Wang et al. |

FOREIGN PATENT DOCUMENTS

JP  05-291226  11/1993

OTHER PUBLICATIONS

International Search Report and Written Opinion dated Sep. 26, 2017 for Application No. PCT/US2017/024745.

* cited by examiner

*Primary Examiner* — David G Cormier
(74) *Attorney, Agent, or Firm* — Patterson + Sheridan LLP

(57) ABSTRACT

Embodiments of the present disclosure generally relate to cleaning substrates, and more particularly, to methods and apparatus for endpoint detection of a cleaning process. The apparatus includes an outer cleaning basin, a liner, and a circulation system coupled to the liner. The circulation system includes a filter for removing particles from a fluid. A liquid particle counter is fluidly coupled to fluid in the liner for performing particle counting. Methods for using the apparatus are also described.

20 Claims, 3 Drawing Sheets

LIQUID PARTICLE COUNTING OF SEMICONDUCTOR COMPONENT PARTS

CROSS-REFERENCE TO RELATED APPLICATIONS

This application claims benefit of U.S. Provisional Patent Application Ser. No. 62/348,529, filed Jun. 10, 2016, and U.S. Provisional Patent Application Ser. No. 62/336,253, filed May 13, 2016, which is herein incorporated by reference.

BACKGROUND

Field

Embodiments of the present disclosure generally relate to cleaning substrates, and more particularly, to methods and apparatus for endpoint detection of a cleaning process.

Description of the Related Art

In semiconductor substrate processing, the trend towards increasingly smaller feature sizes and line-widths has placed a premium on the ability to mask, etch, and deposit material on a semiconductor substrate with greater precision. As semiconductor features shrink, device structures become more fragile. Meanwhile, the killer defect size, defined as the smallest stray particle which renders the device non-functional if not removed during a cleaning step, becomes smaller and more difficult to remove from the surface. Consequently, reducing device damage is one of the major issues facing the cleaning processes. As a result, this trend towards increasingly smaller feature sizes has placed a premium on the cleanliness of semiconductor manufacturing processes including the chamber component parts used in such processes.

Currently, cleaning processes which rely on particle counting to determine the end point of a cleaning process require off-line lab analysis during the component part cleaning process. This requires the operator to cease the cleaning process and manually pull a sample of the cleaning solution used in the cleaning process. This sample is then sent to a lab for analysis. Alternatively, the part itself may be removed from the cleaning solution, and transferred to a remote location for particle location. These labor intensive processes not only contribute to a significant increase in processing time but also increase tool downtime for the tool from which the part has been removed. This increase in tool downtime leads to a corresponding increase in the cost of ownership (CoO).

Therefore, there is a need for an apparatus and method for cleaning chamber component parts that reduces downtime for chamber maintenance and cleaning.

SUMMARY

In one embodiment, a cleaning system comprises an outer basin; a liner disposed within the outer basin for maintaining fluid; a circulation system coupled to the basin for circulating the fluid in the liner, the circulation system comprising a filter for removing particles from the fluid; and a liquid particle counter in communication with the fluid.

In another embodiment, a cleaning system comprises an outer basin; a liner disposed within the outer basin for maintaining fluid; a circulation system coupled to the basin for circulating the fluid in the liner, the circulation system comprising: a first liquid particle counter; and a filter; and a second liquid particle counter in fluid communication with the liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to cleaning substrates, and more particularly, to methods and apparatus for endpoint detection of a cleaning process. The apparatus includes an outer cleaning basin, a liner, and a circulation system coupled to the liner. The circulation system includes a filter for removing particles from a fluid. A liquid particle counter is fluidly coupled to fluid in the liner for performing particle counting. Methods for using the apparatus are also described.

Figure 1A:
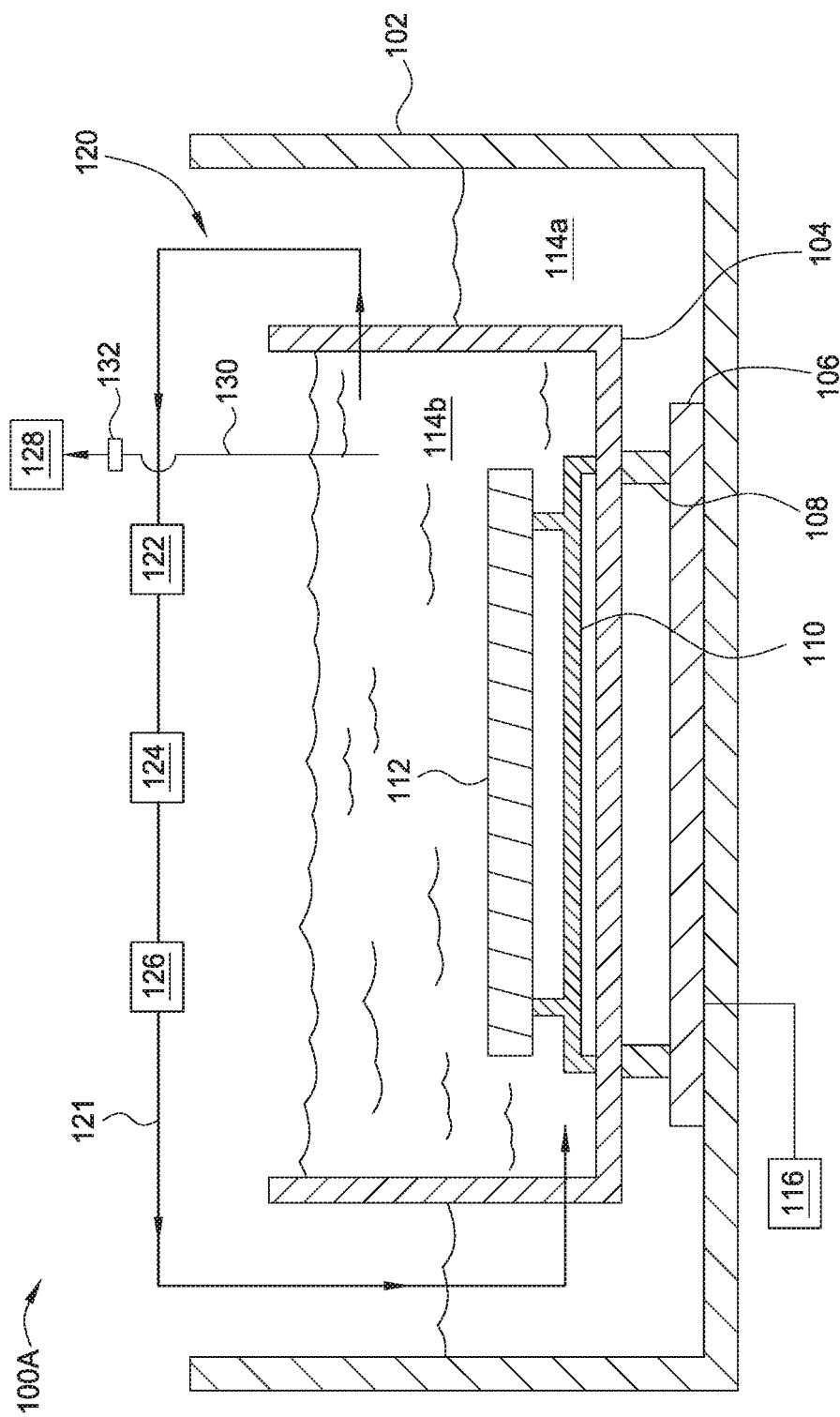
FIG. 1A is a schematic illustration of a cleaning system, according to one aspect of the disclosure.

FIG. 1A is a schematic illustration of a cleaning system 100A, according to one aspect of the disclosure. The cleaning system 100A includes an outer cleaning basin 102 which surrounds a liner 104. A transducer 106 is positioned in a lower portion of the outer cleaning basin 102. An optional support 108 is positioned on the transducer 106 to support the liner 104 and to space the liner 104 from the transducer 106. Optionally, the support 108 may be positioned such that the liner 104 rests on an interior surface of the outer cleaning basin 102, and thus, not in contact with the transducer 106. A workpiece support 110 is positioned within the liner 104 to facilitate support of a workpiece 112 during a cleaning practice.

The outer cleaning basin 102 and the liner 104 may each be circular, oval, polygonal, square, rectangular, or any other suitable shape for containing fluids 114a, 114b, respectively therein. In one embodiment, the liner 104 may be fabricated from a material such as polypropylene (PP), polyethylene (PE)) polyvinyl difluoride (PVDF), while the outer cleaning basin 102 may be formed from stainless steel or coated metal (e.g., aluminum with an ethylene tetrafluoroethylene (ETFE) coating). Other materials that will not be attacked by the cleaning chemistry and will not produce a significant amount of particulates are also contemplated. The liner 104 may be removed and replaced depending on the material of the workpiece 112 located therein in order to reduce cross-contamination. In one example, the fluids 114a, 114b contained within each of the outer cleaning basin 102 and the liner 104 are de-ionized water. It is contemplated that the fluids 114a, 114b contained within each of the outer cleaning basin 102 and the liner 104 may be other fluids, such as one or more solvents, a cleaning solution such as standard clean 1 (SC1), selective deposition removal reagent (SDR), surfactants, acids, bases, or any other chemical useful for removing contaminants and/or particulates from a component part.

The transducer 106 is configured to provide either ultrasonic or megasonic energy to the fluids 114a, 114b to facilitate cleaning of the workpiece 112. The transducer 106 may be implemented, for example, using piezoelectric actuators, or any other suitable mechanism that can generate vibrations at ultrasonic or megasonic frequencies of desired amplitude. The transducer 106 may be a single transducer, as illustrated, or may be an array of transducers, oriented to direct ultrasonic energy into the liner 104 where the workpiece 112 is positioned. The transducer 106 may be configured to direct ultrasonic or megasonic energy in a direction normal to an edge of the workpiece 112, or at an angle relative to the normal direction. In one embodiment, the transducer 106 is dimensioned to be approximately equal in length to a mean or outer diameter of the workpiece 112. In another embodiment, the transducer 106 may have a length greater than the length of the workpiece 112. Power may be applied to the transducer from a power supply 116, such as an RF power supply.

When the transducer 106 directs energy into the liner 104 through the fluid 114a, acoustic streaming, e.g., streams of micro bubbles, within the fluid 114b are induced. The acoustic streaming aids the removal of contaminants from the workpiece 112, and keeps the removed particles in motion within the fluid 114b. The continued motion of the cleaning particles reduces the likelihood of reattachment of the removed particles to the workpiece 112. The particles are removed from the fluid 114b via a circulation system 120.

The circulation system 120 removes fluid 114b from liner 104, circulates the fluid 114b though an inline liquid particle counter (LPC) 122 and a filter 124, and then returns the fluid 114b to the liner 104 via first piping 121. A pump 126 may be utilized to facilitate movement of the fluid 114b through the circulation system 120. It is contemplated that the ordering of the LPC 122, the filter 124, and the pump 126 may be varied. The LPC 122 measures the amount of particulate in the fluid 114b, thus indicating the extent of cleaning of the workpiece 112. The filter 124 removes the particulates from the fluid 114b after the measurement operation and prior to returning the fluid 114b to the liner 104. Exemplary filter sizes may include 0.01 micron to 10 micron filters. Exemplary filter sizes may also include 0.04 micron to 1 micron filters. Although a single filter 124 is shown in FIG. 1A, it should be understood that the embodiments described herein contemplate the use of multiple filters of similar or varying sizes. A process endpoint may be determined via the LPC 122 as the particle count measured via the LPC 122 decreases. An endpoint of the filtering process may be indicated by reaching a predetermined particle count in the fluid 114b as measured by the LPC 122.

The LPC 122 uses a high energy light source to illuminate particles as the particles pass through a detection chamber. As the particle passes through a beam generated by the light source (typically a laser), redirected light is detected by a photodetector. The endpoint may be determined by monitoring the light blocked by the particles of the fluid 114b. The amplitude of the light scattered or light blocked is measured and the particle is counted and tabulated. Exemplary LPC devices include, for example, the KS-42A Liquid-Borne Particle Counter available from RION Co., Ltd. of Japan. In certain embodiments, the LPC 122 includes an internal pump.

The cleaning system 100A also includes a second LPC 128, e.g., an offline LPC. A sample of the fluid 114b is provided to the second LPC 128 through second piping 130 via a pump 132. The second LPC is adapted to perform analysis on the fluid 114b after the endpoint of filtering through the circulation system 120. In one example, the second LPC 128 may use light or measurement techniques, similar to the LPC 122. Other techniques are also contemplated.

Conventional cleaning processes use batch liquid particle counting tests that require off-line lab analysis during the chamber component part cleaning process. This requires the system operator to manually pull a sample of the cleaning solution and send the sample off-site for particle analysis. If the sample does not meet the required specifications for particle count, continued cleaning of the part is required along with the pulling of additional samples and corresponding tool downtime for particle count analysis. This results in high cost for repeated lab analysis followed by repeated cleaning sequences. However, aspects of the present disclosure are capable of performing inline and offline measurements onsite, without requiring an operator to pull a sample. Thus, offline liquid particle counting, which is generally more accurate than inline liquid particle counting, can be more quickly performed using aspects of the present disclosure, while the chance of contamination as well as downtime are minimized.

While FIG. 1A illustrates one embodiment, other embodiments are also contemplated. While only one transducer 106 is shown positioned below the liner 104, multiple transducers may be used. For example, additional or alternative transducers 106 may be placed in a vertical orientation along the side of the liner 104 to direct ultrasonic or megasonic energy toward the workpiece 112 from the side. The transducer 106 may be positioned inside the liner 104 or outside of the liner 104 for indirect ultrasonication. The transducer 106 may be positioned outside of the outer cleaning basin 102. In one embodiment, the transducer 106 may be positioned in the outer cleaning basin 102 to direct ultrasonic or megasonic energy toward the workpiece 112.

Figure 1B:
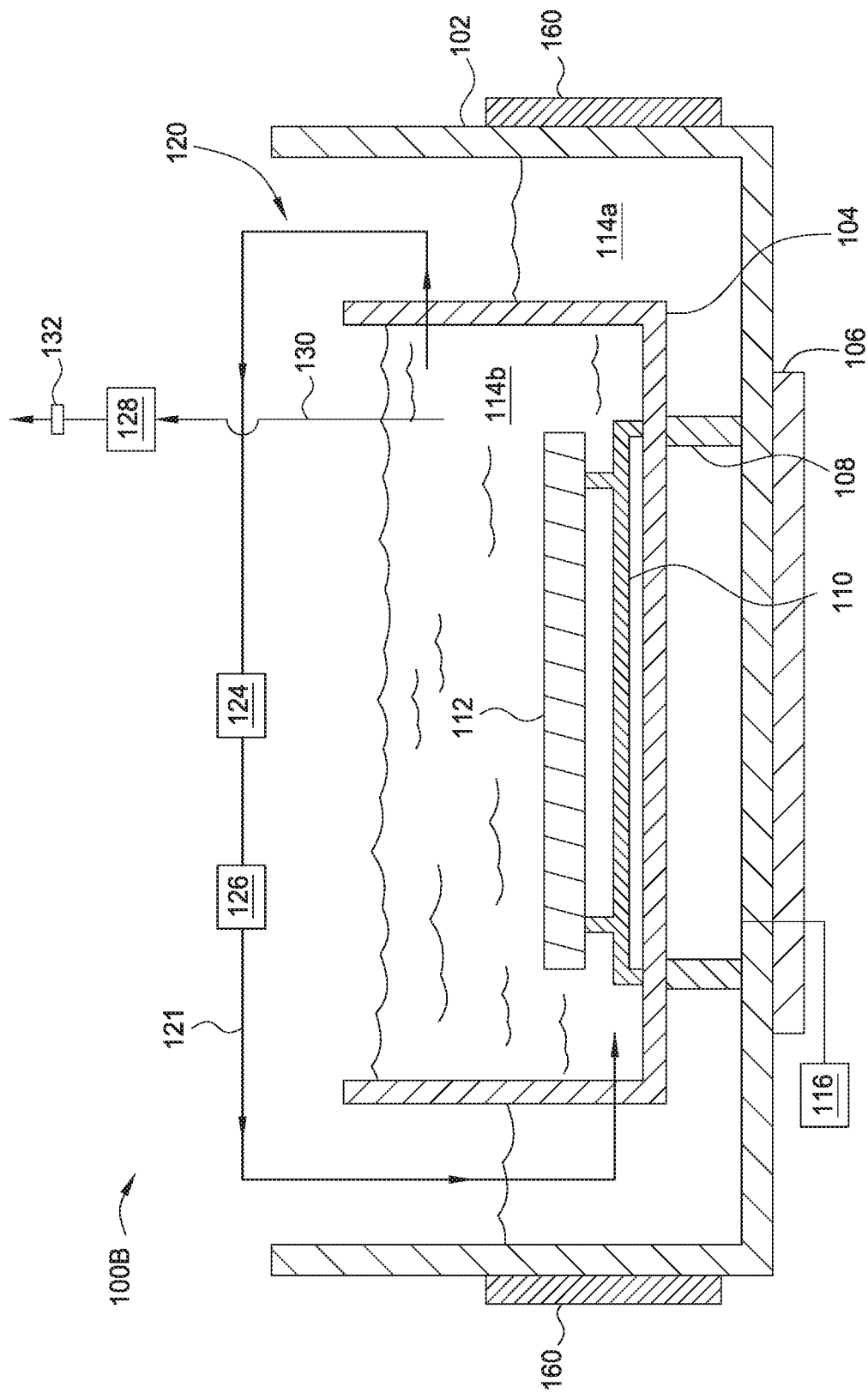
FIG. 1B is a schematic illustration of a cleaning system, according to one aspect of the disclosure.

FIG. 1B is a schematic illustration of a cleaning system 100B, according to one aspect of the disclosure. The cleaning system 100B is similar to the cleaning system 100A. However, the cleaning system 100B includes a transducer 106 positioned outside of the outer cleaning basin 102, rather than inside the outer cleaning basin 102, as illustrated in FIG. 1A. Positioning the transducer 106 outside the outer cleaning basin 102 reduces contamination of the fluid 114a, and also reduces wear on the transducer 106. Moreover, maintenance of the transducer 106 is simplified when the transducer is located outside the outer cleaning basin 102. Additionally, the cleaning system 100B includes one or more transducers 160 (two are shown) coupled to the vertical walls of the outer cleaning basin 102 to direct energy towards the fluid 114b to facilitate cleaning of the workpiece 112. The additional transducers 160 facilitate improved cleaning and reduced cleaning times.

In the cleaning system 100B, the pump 132 is positioned downstream of the LPC 128. In such an embodiment, measurements of the fluid 114b by the LPC 128 may be more accurate since contamination from the pump 132 is mitigated. Additionally, in the embodiment illustrated in FIG. 1B, only a single LPC is utilized. In such an embodiment, the LPC 122 (shown in FIG. 1A) has been omitted, and the LPC 128 performs both inline and offline LPC measurements. The LPC 128 performs inline measurements while the circulation system 120 is operating, and performs offline measurements when the circulation system 120 is not operating. The utilization of a single LPC reduces the cost of equipment compared to the cleaning system 100A, which utilizes multiple LPCs.

In general, a system controller (not shown) may be used to control one or more controller components found in the cleaning system 100A or 100B. The system controller is generally designed to facilitate the control and automation of the overall cleaning system 100A or 100B and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, processing temperature, I/O signals, transducer power, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller determines which tasks are performable on a substrate. Preferably, the program is software readable by the system controller that includes code to perform tasks relating to monitoring, execution and control of the movement, support, and/or positioning of a substrate along with the various process recipe tasks and various chamber process recipe steps being performed in the cleaning system 100A or 100B. In one embodiment, the system controller also contains a plurality of programmable logic controllers (PLC's) that are used to locally control one or more modules in the cleaning system 100A.

Figure 2:
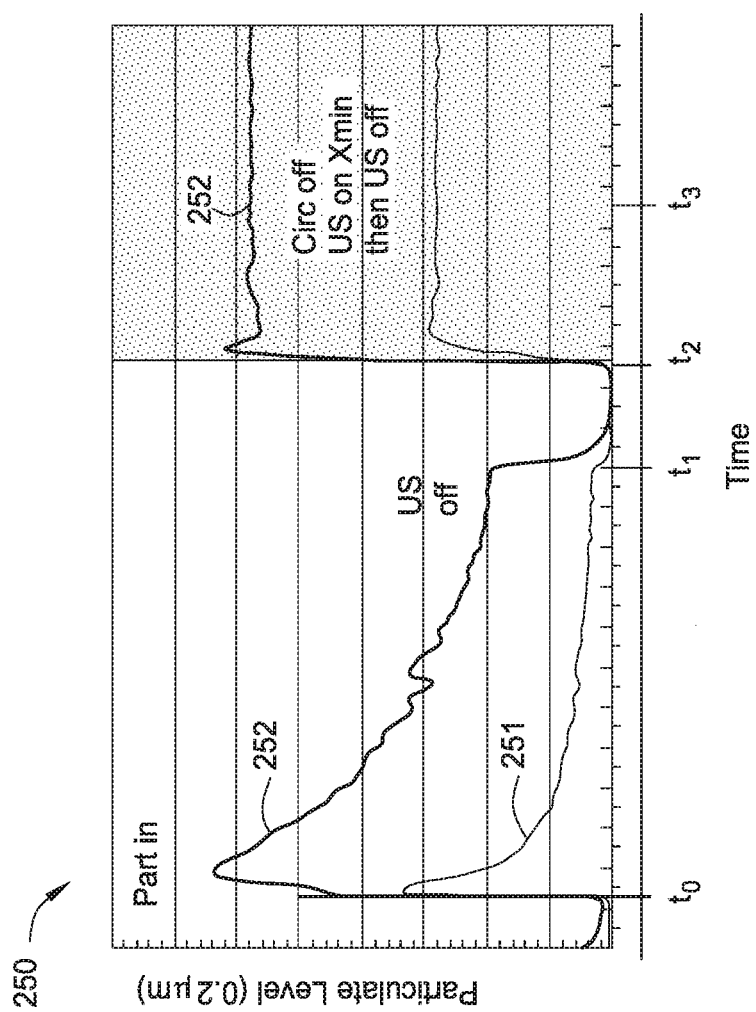
FIG. 2 is a graph illustrating particle counting during a cleaning process, according to one aspect of the disclosure.

FIG. 2 is a graph 250 illustrating particle count during a cleaning process, according to one aspect of the disclosure. To facilitate explanation of FIG. 2, FIG. 2 will be explained with reference to FIG. 1B. At $t_0$, a workpiece 112 is positioned in liner 104, and the transducer 106 is powered to create acoustic streaming in the liner 104. From $t_0$ until $t_1$, particles are removed from the workpiece 112 due to the acoustic streaming, and enter the fluid 114b. The fluid 114b is removed from the liner 104 via the circulation system 120, wherein the fluid 114b is measured via the LPC 128, filtered via the filter 124, and returned to the liner 104. These operations are repeated until the particle level reaches a predetermined endpoint, as measured by the LPC 128. The endpoint is indicated by the particle level at time $t_1$. A line 252 indicates the concentration of particles measured by the LPC 128, and more specifically, particles having a size of at least 0.2 microns. However, it is contemplated that other sizes may alternatively or additionally be monitored. For example, particles having a size range of about 0.03 microns to about 1 micron, such as about 0.5 microns, may be measured.

At time $t_1$, the transducer 106 is turned off, while the flow through the circulation system 120 continues. Filtering of the fluid 114b continues from time $t_1$ and time $t_2$. At time $t_2$, the transducer 106 is turned on while circulation through the circulation system 120 is turned off (and thus, providing a fixed volume for purposes of LPC measurements). At time $t_3$, which may be about X minutes from time $t_2$, such as about 1-30 minutes or about 5-10 minutes, the transducer 106 is turned off, and a sample of the fluid 114b is delivered to the LPC 128. A concentration of the sample is determined, and, by knowing the total volume of the fluid 114b, a total contamination level can be determined. If the sample delivered to the LPC 128 is beneath a predetermined particle count (or concentration), the cleaning process is complete and the workpiece 112 is removed from the liner 104. Otherwise, power is applied to the transducer 106 and the pump 126, and the cleaning operation is repeated from $t_0$. It is contemplated that the first piping 121, the second piping 130, or the filter may be flushed between operations or as desired. While the line 252 illustrates continuous particle counts from $t_0$ until $t_3$ it is contemplated that particle counts may be taken in intervals, for example, every 15 seconds to every 1 minute. A controller, now shown in the figures, may be utilized to automate the operations described herein.

The terms "inline" and "offline" measurements are used herein. Inline measurements generally refer to measurements taken when the volume of the sample is not fixed, or while fluid is moving through the circulation system 120. In contrast, "offline" measurements refer to the measurements taken when the fluid in the system is static and the circulation system 120 is not circulating fluid.

Benefits of the disclosure include reduced likelihood of contamination and improved cleaning times due to a reduction in operator interaction during cleaning. Moreover offline endpoint can be definitely determined at the cleaning vessel. Because the endpoint can be determined immediately at the cleaning vessel, there is no need to wait on sample analysis to be sent offsite, thus eliminating delays in the event continued cleaning is indicated.

While the foregoing is directed to embodiments of the present disclosure, other and further embodiments of the disclosure may be devised without departing from the basic scope thereof, and the scope thereof is determined by the claims that follow.

What is claimed is:
1. A cleaning system, comprising:
an outer basin;
a liner disposed within the outer basin for maintaining fluid;
a circulation system coupled to the outer basin for circulating the fluid in the liner, the circulation system comprising:
a first piping in fluid communication with an interior of the liner;
a filter disposed on the first piping for removing particles from the fluid; and
a first liquid particle counter disposed on the first piping and upstream from the filter;
a second liquid particle counter offline from the circulation system;
a second piping configured to provide the fluid contained in the liner to the second liquid particle counter; and
a controller configured to control flow of the fluid in the cleaning system, wherein
the controller is configured to cause the first liquid particle counter to perform inline measurements while flowing fluid through the circulation system and to cause the second liquid particle counter to perform offline measurements while not flowing fluid through the circulation system.

2. The cleaning system of claim 1, wherein the liner comprises polypropylene, polyethylene, or polyvinyl difluoride.

3. The cleaning system of claim 1, wherein the outer basin comprises stainless steel.

4. The cleaning system of claim 1, wherein the outer basin comprises a coated metal.

5. The cleaning system of claim 4, wherein the coated metal is aluminum coated with ethylene tetrafluoroethylene.

6. The cleaning system of claim 1, further comprising a transducer positioned between the outer basin and the liner for agitating solutions contained with the outer basin and the liner.

7. The cleaning system of claim 1, further comprising a transducer positioned outside the outer basin and the liner for agitating solutions contained within the outer basin and the liner, the transducer positioned beneath a bottom of the outer basin.

8. The cleaning system of claim 7, further comprising one or more additional transducers coupled to vertical walls of the outer basin.

9. The cleaning system of claim 7, wherein the transducer generates vibrations at ultrasonic or megasonic frequencies.

10. A cleaning system, comprising:
   an outer basin;
   a liner disposed within the outer basin for maintaining fluid;
   a circulation system coupled to the liner for circulating the fluid therein;
   a first liquid particle counter inline with the circulation system;
   a filter inline with the first liquid particle counter;
   a second liquid particle counter offline from the circulation system; and
   a controller configured to control flow of the fluid in the cleaning system,
   wherein the controller is configured to cause the first liquid particle counter to perform inline measurements while flowing fluid through the circulation system and to cause the second liquid particle counter to perform offline measurements while not flowing fluid through the circulation system.

11. The cleaning system of claim 10, wherein the first and second liquid particle counters are connected to different pumps.

12. The cleaning system of claim 10, further comprising a support positioned between the outer basin and the liner for supporting the liner.

13. The cleaning system of claim 10, further comprising a pump that delivers fluid from an interior of the liner to the second liquid particle counter.

14. The cleaning system of claim 10, wherein the liner comprises polypropylene, polyethylene, or polyvinyl difluoride.

15. The cleaning system of claim 10, wherein the outer basin comprises stainless steel.

16. The cleaning system of claim 10, wherein the outer basin comprises a coated metal.

17. The cleaning system of claim 16, wherein the coated metal is aluminum coated with ethylene tetrafluoroethylene.

18. The cleaning system of claim 10, further comprising a transducer positioned between the outer basin and the liner for agitating solutions contained with the outer basin and the liner.

19. The cleaning system of claim 10, further comprising:
   a transducer positioned outside the outer basin and the liner for agitating solutions contained with the outer basin and the liner, the transducer positioned beneath a bottom of the outer basin; and
   one or more additional transducers coupled to vertical walls of the outer basin.

20. A cleaning system, comprising:
   an outer basin comprising stainless steel;
   a liner disposed within the outer basin for maintaining fluid, the liner comprising polypropylene, polyethylene, or polyvinyl difluoride;
   a circulation system coupled to the liner for circulating the fluid therein, the circulation system comprising a first pump and a filter for removing particles from the fluid;
   a liquid particle counter in fluid communication with an interior of the liner;
   a second pump disposed upstream of the liquid particle counter to move fluid from the interior of the liner through the liquid particle counter; and
   a controller configured to control flow of the fluid in the cleaning system, wherein
   the liquid particle counter is offline from the circulation system, and
   the controller is configured to cause the liquid particle counter to perform inline measurements while flowing fluid through the circulation system and offline measurements while not flowing fluid through the circulation system.

* * * * *